US011538728B2

(12) United States Patent
Fujino et al.

(10) Patent No.: US 11,538,728 B2
(45) Date of Patent: Dec. 27, 2022

(54) SEMICONDUCTOR PACKAGE COMPRISING A HEAT DISSIPATION STRUCTURE AND AN OUTER PERIPHERAL FRAME USED AS A RESIN FLOW BARRIER

(71) Applicant: Mitsubishi Electric Corporation, Tokyo (JP)

(72) Inventors: Junji Fujino, Tokyo (JP); Soichi Sakamoto, Tokyo (JP); Katsumi Miyawaki, Tokyo (JP); Hiroaki Ichinohe, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 74 days.

(21) Appl. No.: 16/759,608

(22) PCT Filed: Nov. 30, 2018

(86) PCT No.: PCT/JP2018/044204
§ 371 (c)(1),
(2) Date: Apr. 27, 2020

(87) PCT Pub. No.: WO2019/124024
PCT Pub. Date: Jun. 27, 2019

(65) Prior Publication Data

US 2020/0321261 A1 Oct. 8, 2020

(30) Foreign Application Priority Data

Dec. 20, 2017 (JP) ............................ JP2017-243436

(51) Int. Cl.
*H01L 23/367* (2006.01)
*H01L 21/48* (2006.01)
(Continued)

(52) U.S. Cl.
CPC ........ *H01L 23/367* (2013.01); *H01L 21/4882* (2013.01); *H01L 21/565* (2013.01);
(Continued)

(58) Field of Classification Search
CPC . H01L 23/367; H01L 21/4882; H01L 21/565; H01L 23/3128; H01L 24/16;
(Continued)

(56) References Cited

U.S. PATENT DOCUMENTS 6,144,101 A * 11/2000 Akram .................... H01L 23/50 257/778
2007/0262427 A1 11/2007 Koide
(Continued)

FOREIGN PATENT DOCUMENTS

EP 3407378 A1 11/2018
JP H06224334 A 8/1994
(Continued)

OTHER PUBLICATIONS

International Search Report (PCT/ISA/210) dated Feb. 5, 2019, by the Japan Patent Office as the International Searching Authority for International Application No. PCT/JP2018/044204.

*Primary Examiner* — Marcos D. Pizarro
(74) *Attorney, Agent, or Firm* — Buchanan Ingersoll & Rooney PC

(57) ABSTRACT

A semiconductor package includes: an insulating substrate; a first semiconductor chip; a second semiconductor chip with a thickness smaller than a thickness of the first semiconductor chip; a heat radiation member in which a main surface located on an opposite side of an active surface of the first semiconductor chip and an active surface of the second semiconductor chip, respectively, are bonded to a lower surface; and a sealing resin having contact with at least part of a side wall of the heat radiation member without
(Continued)

100

A 62 61 32 22 12 2 3 11 2 21 32 A 41 5 42 being raised over an upper surface of the heat radiation member to seal the first and second semiconductor chips on the insulating substrate, wherein in the heat radiation member, a thickness of a first bonding part to which the first semiconductor chip is bonded is smaller than a thickness of a second bonding part to which the second semiconductor chip is bonded.

10 Claims, 11 Drawing Sheets

(51) Int. Cl.

| | |
|---|---|
| ***H01L 21/56*** | (2006.01) |
| ***H01L 23/31*** | (2006.01) |
| ***H01L 23/00*** | (2006.01) |
| ***H01L 25/065*** | (2006.01) |
| ***H01L 25/075*** | (2006.01) |
| ***H01L 25/04*** | (2014.01) |

(52) U.S. Cl.
CPC .......... *H01L 23/3128* (2013.01); *H01L 24/16* (2013.01); *H01L 25/042* (2013.01); *H01L 25/0655* (2013.01); *H01L 25/0753* (2013.01); *H01L 2224/16225* (2013.01); *H01L 2224/26175* (2013.01)

(58) Field of Classification Search
CPC ........... H01L 2224/16225; H01L 25/18; H01L 24/32; H01L 24/92; H01L 2224/81192; H01L 2224/95; H01L 2224/83192; H01L 2224/92242; H01L 2224/32245; H01L 25/0655; H01L 23/295; H01L 23/24; H01L 21/561; H01L 23/49816; H01L 23/4334; H01L 2224/73253; H01L 2924/15311; H01L 21/56; H01L 25/042; H01L 25/072; H01L 25/0753; H01L 2224/26175
See application file for complete search history.

(56) References Cited

U.S. PATENT DOCUMENTS

| | | | |
|---|---|---|---|
| 2014/0168901 A1 | 6/2014 | Ide et al. | |
| 2014/0264799 A1 | 9/2014 | Gowda et al. | |
| 2014/0264800 A1 | 9/2014 | Gowda et al. | |
| 2015/0194375 A1 | 7/2015 | Gowda et al. | |
| 2015/0311095 A1 | 10/2015 | Okada et al. | |
| 2017/0077014 A1 | 3/2017 | Gowda et al. | |
| 2017/0263539 A1 | 9/2017 | Gowda et al. | |
| 2017/0287805 A1 | 10/2017 | Ozawa et al. | |
| 2017/0294422 A1* | 10/2017 | Solimando | H01L 25/50 |

FOREIGN PATENT DOCUMENTS

| | | | |
|---|---|---|---|
| JP | H09246433 | A | 9/1997 |
| JP | 2002158316 | A | 5/2002 |
| JP | 2004134592 | A | 4/2004 |
| JP | 2007184424 | A | 7/2007 |
| JP | 2007188934 | A | 7/2007 |
| JP | 4593616 | B2 | 12/2010 |
| JP | 2013073964 | A | 4/2013 |
| JP | 2014179612 | A | 9/2014 |
| JP | 2015211091 | A | 11/2015 |
| JP | 2017183521 | A | 10/2017 |
| WO | 2017145331 | A1 | 8/2017 |

* cited by examiner

F I G. 1
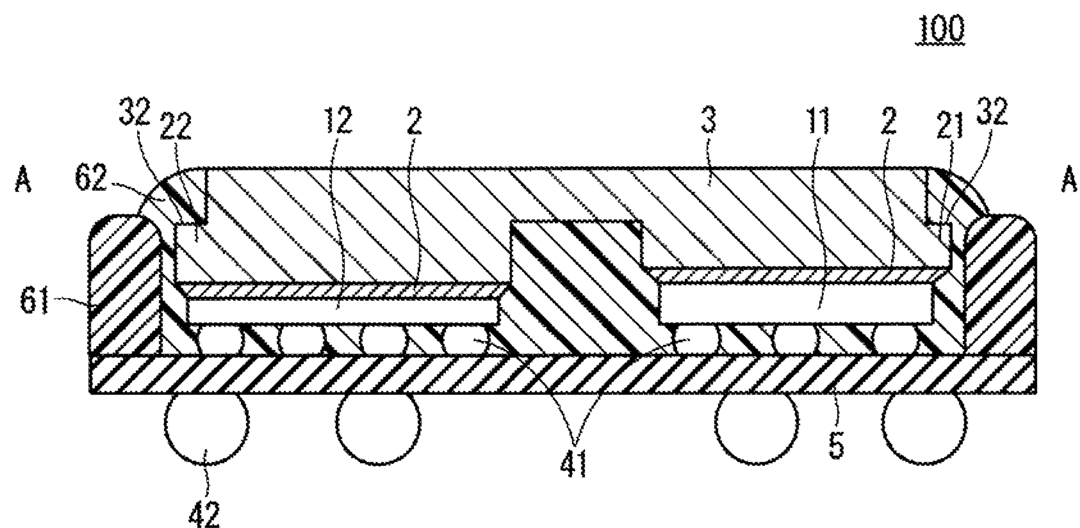
F I G. 2
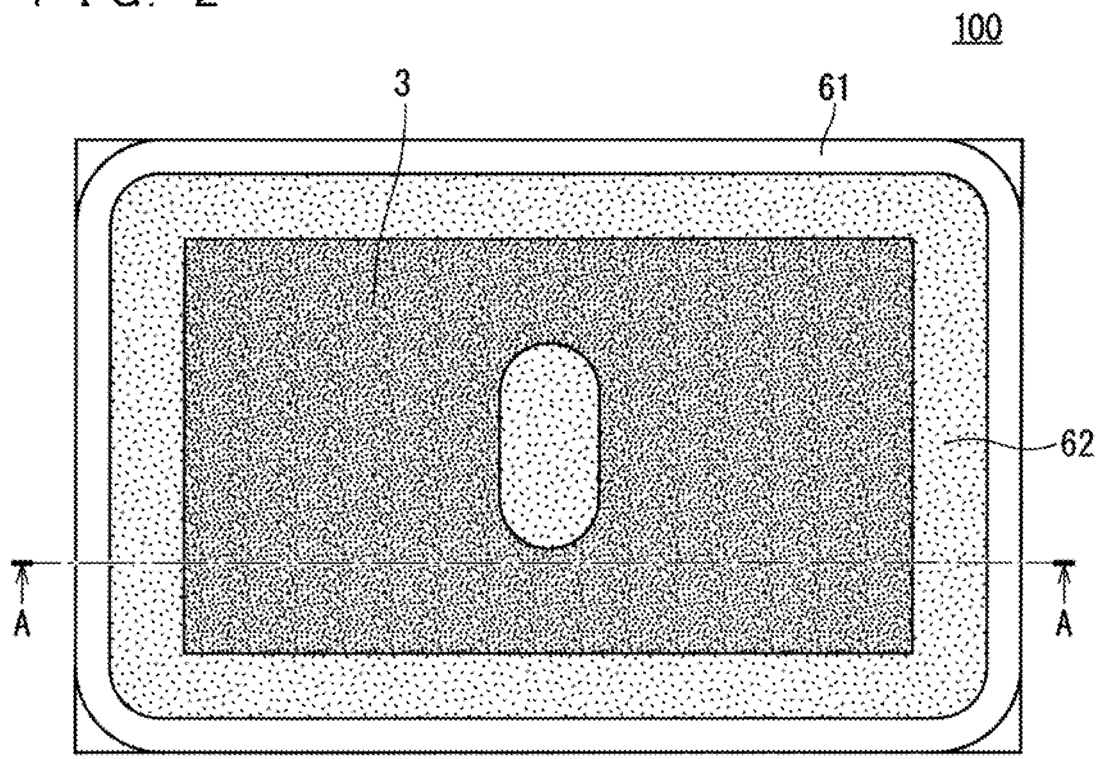

F I G. 3
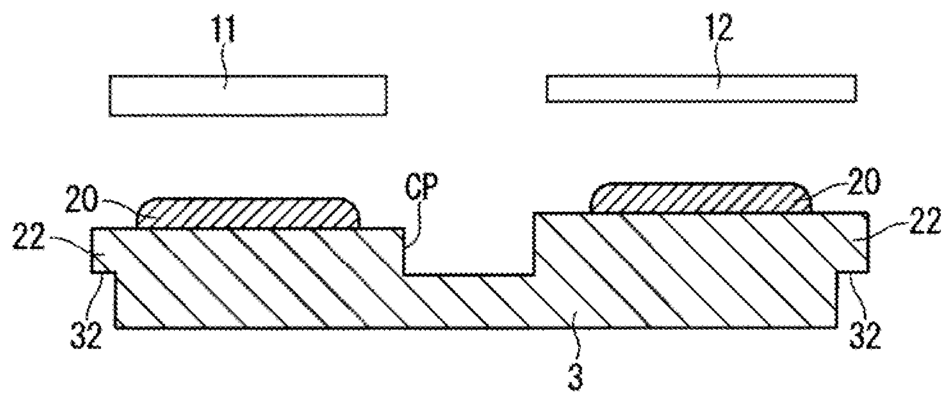
F I G. 4
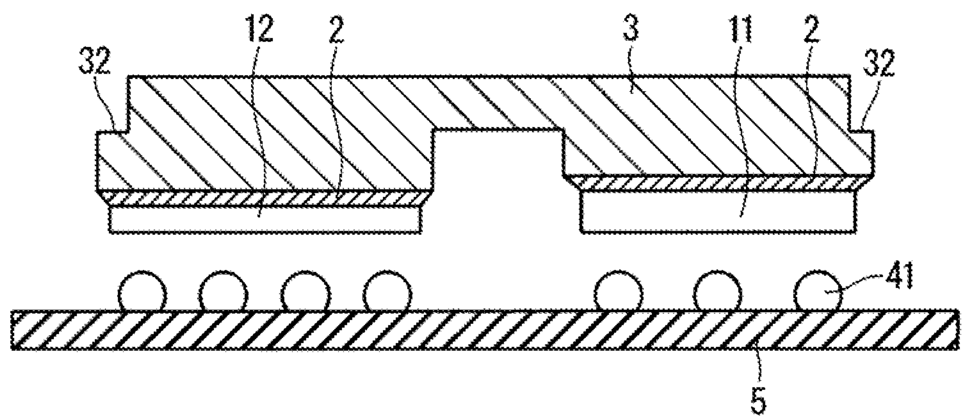
F I G. 5
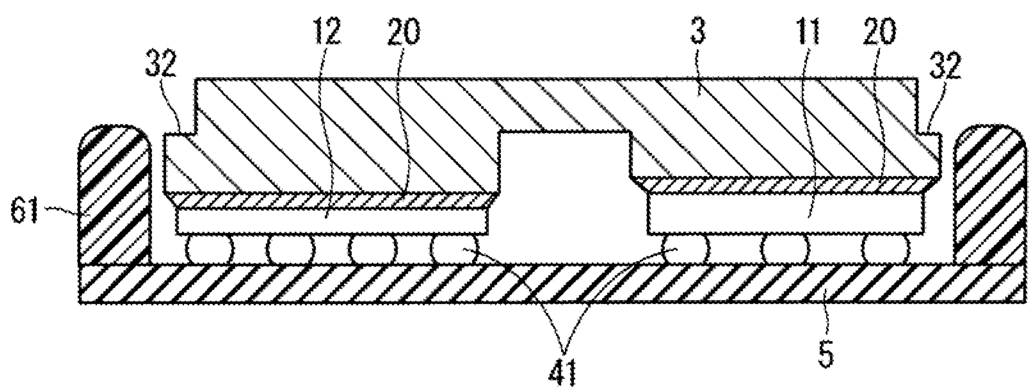

F I G. 6
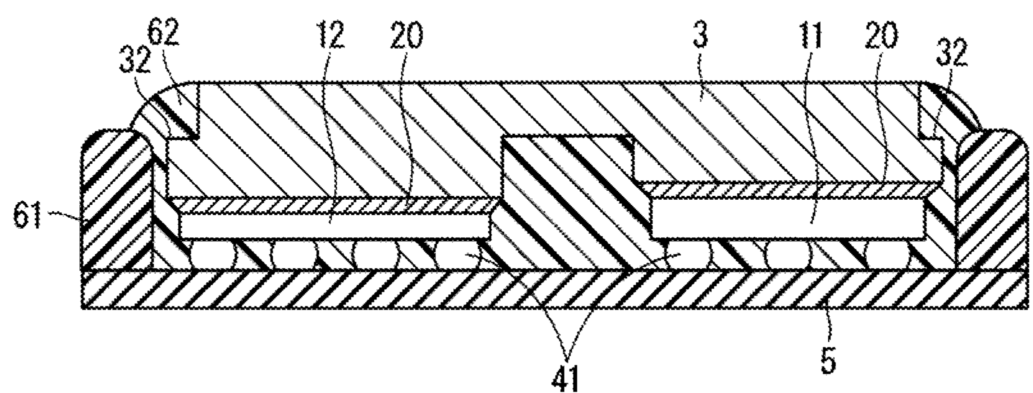
F I G. 7
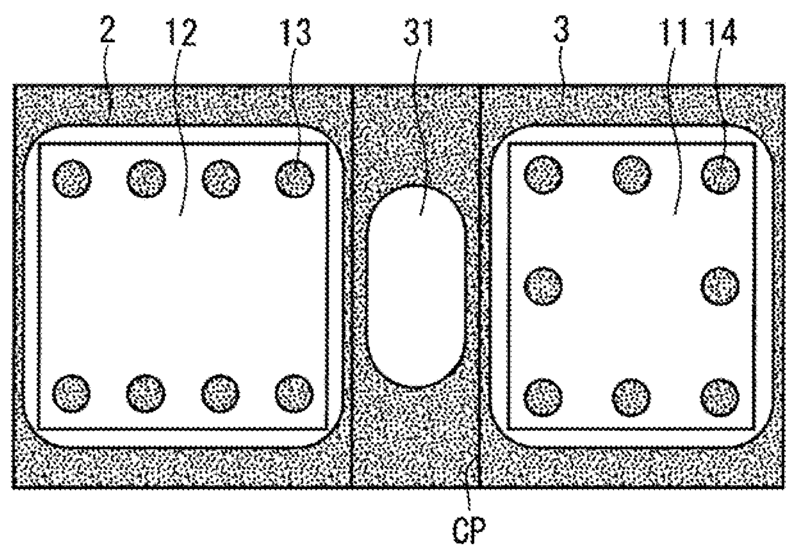

F I G. 17
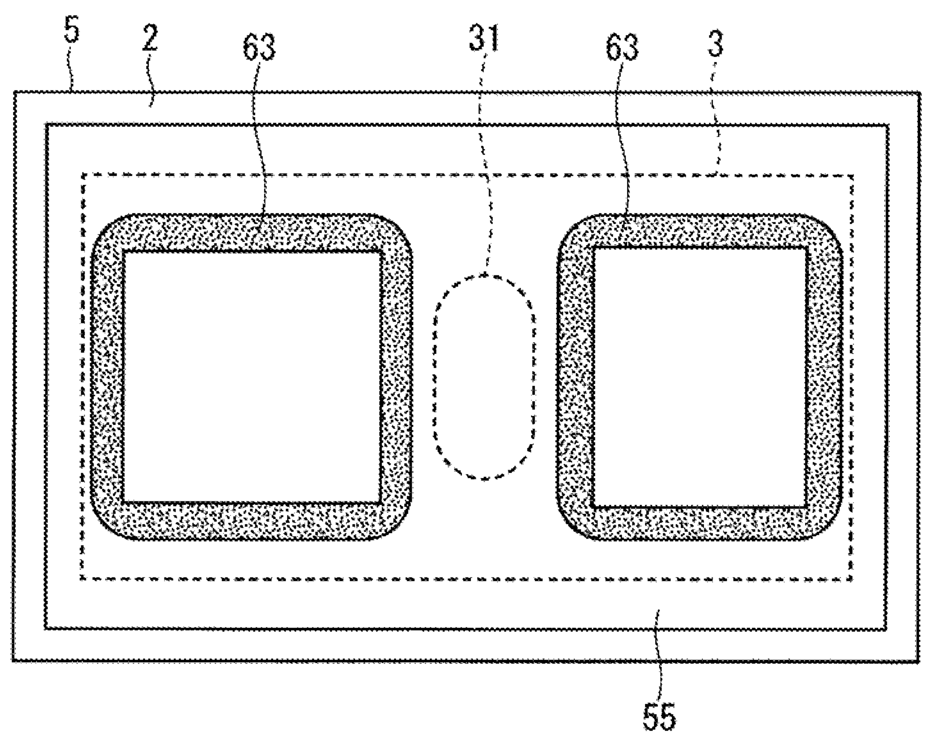

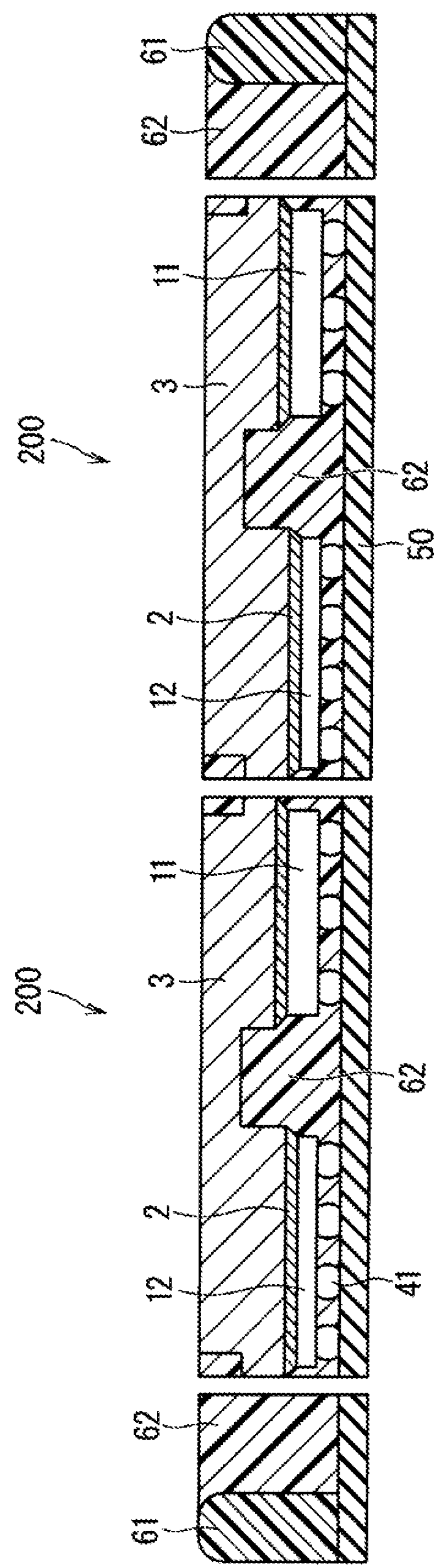
F I G. 1 9

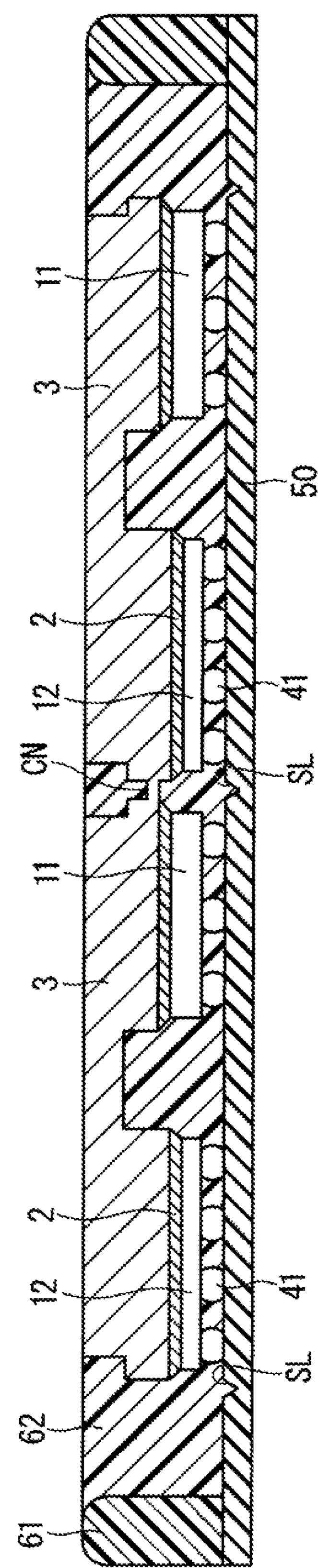
F I G. 2 0

SEMICONDUCTOR PACKAGE COMPRISING A HEAT DISSIPATION STRUCTURE AND AN OUTER PERIPHERAL FRAME USED AS A RESIN FLOW BARRIER

TECHNICAL FIELD

The present invention relates to a semiconductor package, and particularly to a semiconductor package having a heat radiation member radiating heat generated from a semiconductor device.

BACKGROUND ART

Heat generated from a semiconductor device tends to increase in accordance with a higher frequency and speeding up of operation in the semiconductor device, and a semiconductor package having a structure in which a heat spreader is contacted by a main surface of a semiconductor chip as a heat radiation member for radiating the heat outside becomes increasingly common. Patent Document 1 is an example thereof.

In a multi-chip package having a plural types of chip-type semiconductor devices (semiconductor chips), when a height of the heat spreader contacting a main surface of each semiconductor chip due to a difference of a thickness of each semiconductor chip, an abrasive process is necessary to make a main surface (an upper surface) of each of the plurality of heat spreaders have a uniform thickness after the semiconductor devices are packaged.

Patent Document 2 discloses a configuration of locating a heat radiation member doubling as an emitter electrode across a plurality of semiconductor chips in a multi-chip package having the plural types of semiconductor chips. However, disclosed is that when a transfer molding method is used for an insulation sealing, a sealing resin remains on the heat spreader unless adhesion between a mold and the heat spreader is not complete, thus a process of removing the sealing resin using sandblast processing, for example, is necessary to prevent reduction in a heat radiation property.

The abrasion processing and the sandblast processing on the semiconductor package need to be performed little by little in consideration of a damage of the semiconductor package caused by impact, and constitute a major cause of a reduction in productivity by reason that an accurate dimension measurement and a cleaning process are needed, for example.

Patent Document 3 discloses a configuration that bending processing is performed on a heat sink, which is a heat radiation member, to uniform an active surface when a semiconductor chip having a different thickness is bonded to the heat sink. However, when this configuration is adopted, a difference in level occurs in a back surface of the heat sink on an opposite side of a mounting surface of the semiconductor chip, so that there is a possibility that a surface pressure on a heat radiation grease applied to the back surface of the heat sink becomes non-uniform when the heat sink is bonded to a cooling fin, for example, which is a final heat radiation member, and the uniform radiation cannot be performed.

PRIOR ART DOCUMENTS

Patent Documents

Patent Document 1: Japanese Patent No. 4593616
Patent Document 2: Japanese Patent Application Laid-Open No. 2013-73964
Patent Document 3: Japanese Patent Application Laid-Open No. 2007-184424

SUMMARY

Problem to be Solved by the Invention

As described above, in the multi-tip package having the plural types of semiconductor chips, the abrasion process for uniforming the upper surfaces of the plurality of heat spreader is needed, and the process of removing the sealing resin remaining on the heat spreader is needed, and in such a case, there is a problem that productivity is reduced.

The present invention therefore has been made to solve the above problems, and it is an object of the present invention to provide a semiconductor package which can increase productivity in a multi-tip package having a plural types of semiconductor chips.

Means to Solve the Problem

A semiconductor package according to the present invention includes: an insulating substrate; a first semiconductor chip in which an active surface is bonded on a first main surface of the insulating substrate via a plurality of first bonding materials; a second semiconductor chip, with a thickness smaller than a thickness of the first semiconductor chip, in which an active surface is bonded on the first main surface via a plurality of second bonding materials; a heat radiation member in which a main surface located on an opposite side of the active surface of the first semiconductor chip and the active surface of the second semiconductor chip, respectively, are bonded to a lower surface; a barrier provided on an end edge portion of the first main surface of the insulating substrate and extending in a vertical direction of the first main surface to have a gap with the side wall of the heat radiation member; and a sealing resin having contact with at least part of a side wall of the heat radiation member without being raised over an upper surface of the heat radiation member to seal the first and second semiconductor chips on the insulating substrate, wherein the barrier has a gap with an end edge portion of the heat radiation member and has a height not to be higher than an upper surface of the heat radiation member, and in the heat radiation member, a thickness of a first bonding part to which the first semiconductor chip is bonded is smaller than a thickness of a second bonding part to which the second semiconductor chip is bonded.

Effects of the Invention

According to the semiconductor package of the present invention, there is no sealing resin on the upper surface of the heat radiation member, thus a process of removing the sealing resin by abrasion, for example, is unnecessary, and productivity can be increased.

BRIEF DESCRIPTION OF DRAWINGS

FIG. 1 A cross-sectional view illustrating a configuration of a semiconductor package according to an embodiment 1 of the present invention.

FIG. 2 A plan view illustrating the configuration of the semiconductor package according to the embodiment 1 of the present invention.

FIG. 3 A cross-sectional view for describing a method of manufacturing the semiconductor package according to the embodiment 1 of the present invention.

FIG. 4 A cross-sectional view for describing the method of manufacturing the semiconductor package according to the embodiment 1 of the present invention.

FIG. 5 A cross-sectional view for describing the method of manufacturing the semiconductor package according to the embodiment 1 of the present invention.

FIG. 6 A cross-sectional view for describing the method of manufacturing the semiconductor package according to the embodiment 1 of the present invention.

FIG. 7 A plan view of a heat spreader to which a semiconductor chip is die-bonded.

FIG. 17 A plan view illustrating a configuration of a semiconductor package according to a modification example 6 of the embodiment 1 in the present invention.

FIG. 19 A cross-sectional view for describing the method of manufacturing the semiconductor package according to the embodiment 2 of the present invention.

FIG. 20 A cross-sectional view for describing modification example of the method of manufacturing the semiconductor package according to the embodiment 2 of the present invention.

DESCRIPTION OF EMBODIMENT(S)

Embodiment 1

<Configuration of Device>

Figure 8:
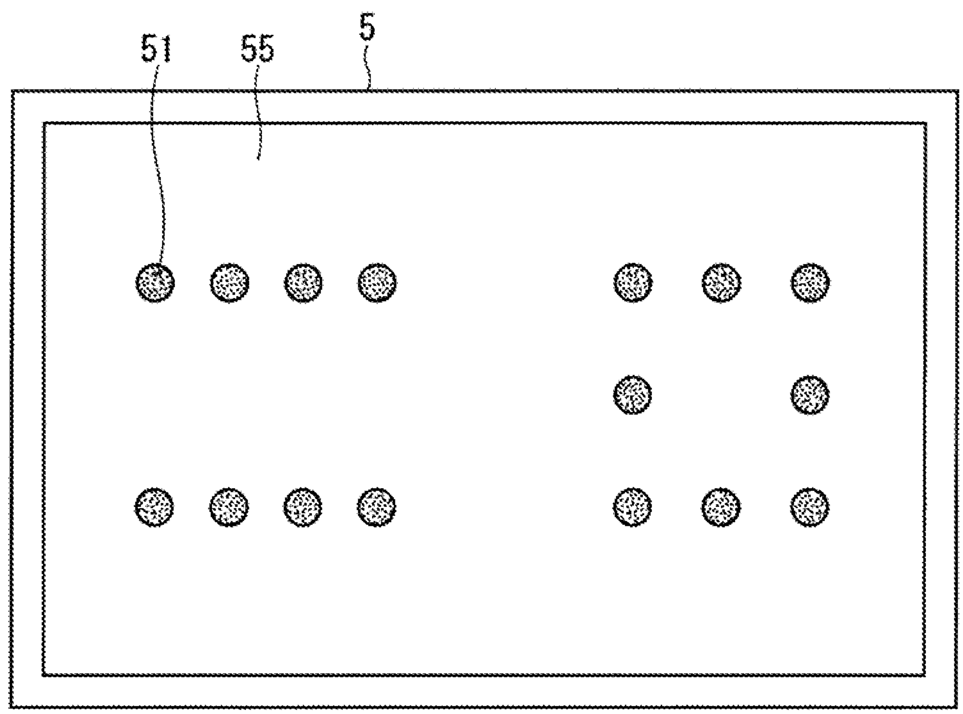
FIG. 8 A plan view of an interposer substrate viewed from an upper surface side.

FIG. 1 is a cross-sectional view illustrating a configuration of a semiconductor package 100 according to an embodiment 1 of the present invention. As illustrated in FIG. 1, in the semiconductor package 100, main surfaces of a semiconductor chip 11 (a first semiconductor chip) and semiconductor chip 12 (second semiconductor chip) are die-bonded on die bond parts 21 and 22 (first and second bonding parts) of a heat spreader 3 (a heat radiation member) via a bonding layer 2, respectively.

Active surfaces which are main surfaces of the semiconductor chips 11 and 12 on an opposite side of the main surfaces from the main surfaces die-bonded on the bonding layer 2 are flip-chip mounted to a plurality of inner bumps 41 disposed on a first main surface (an upper surface) of the interposer substrate 5 which is an insulating substrate, respectively. A plurality of outer bumps 42 are provided on a second main surface (a lower surface) of the interposer substrate 5 on an opposite side from the upper surface on which the inner bump 41 is provided.

A dam 61 (barrier) is provided in proximity to the heat spreader 3 on an end edge portion of the interposer substrate 5 in a state where the semiconductor chips 11 and 12 bonded to the heat spreader 3 are flip-chip mounted to the inner bump 41. A region defined by the dam 61, the heat spreader 3, and the interposer substrate 5 is filled with a sealing resin 62. The semiconductor chips 11 and 12 are resin-sealed. The sealing resin 62 resin-seals the semiconductor chips 11 and 12, and further fills a space between a level difference 32 provided on an end edge portion of the heat spreader 3 and the dam 61. Furthermore, the sealing resin 62 is raised midway in the level difference 32, thereby firmly bonding the beat spreader 3 and the dam 61.

Each of the semiconductor chips 11 and 12 is an Si semiconductor device made up of an Si (silicone) semiconductor, for example. A circuit pattern and an electrode pattern of the semiconductor chip are provided on the active surface, and are bonded to the inner bump 41, thereby enabling an electrical connection between the semiconductor chips 11 and 12 and a unit outside the package via the inner bump 41 and the outer bump 42. Herein, the bonding is defined as a connection between a plurality of members by a conductive material such as a solder or an insulating material such as a resin. The inner bump 41 bonding between the semiconductor chips 11 and 12 and the interposer substrate 5 can be referred to as first and second bonding materials, respectively.

The interposer substrate 5 is a glass epoxy substrate including glass epoxy and a conductive layer such as Cu (copper), for example, and is an intermediate substrate in which a wiring pattern in an upper surface, a lower surface, and an inner side not shown in the drawings is wire-connected by a through hole not shown, thereby electrically connecting the inner bump 41 and the outer bump 42.

The dam 61 provided on the end edge portion of the interposer substrate 5 is formed of a dam agent in which a silica filler is diffused in an epoxy resin, and the sealing resin 62 is formed of a liquid resin in which a silica filler is diffused in an epoxy resin, thereby having an electrical insulation property.

FIG. 2 is a plan view of the semiconductor package 100 illustrated in FIG. 1 viewed from an upper surface side, that is to say, the main surface (the upper surface) of the heat spreader 3 on an opposite side of the die bond parts 21 and 22, and shows the upper surface of the heat spreader 3, the dam 61 surrounding the heat spreader 3, and the sealing resin 62 filling the space between the heat spreader 3 and the dam 61. An opening part 31 for removing gas at a time of injecting the sealing resin 62 is provided on a central portion of the heat spreader 3, and the opening part 31 is filled with the sealing resin 62. There is no sealing resin 62 on the upper surface of the heat spreader 3, however, the upper surface of the heat spreader 3 is exposed as the upper surface of the semiconductor package 100. A cross section in an arrow direction along an A-A line in FIG. 2 corresponds to FIG. 1.

The sealing resin 62 does not remain on the upper surface of the heat spreader 3, thus a process of removing the sealing resin 62 by abrasion, for example, is unnecessary, and productivity can be increased.

<Manufacturing Method>

A method of manufacturing the semiconductor package 100 is described next using FIG. 3 to FIG. 6 which are cross-sectional views sequentially illustrating a manufacturing process.

Firstly, the heat spreader 3 made of Cu is prepared as illustrated in FIG. 3. The heat spreader 3 includes the die bond part 21 mounting the semiconductor chip 11 and the die bond part 22 mounting the semiconductor chip 12. The die bond part 21 has a thickness of 2 mm, for example, from the upper surface of the heat spreader 3, and the die bond part 22 has a thickness of 2.2 mm, for example, from the upper surface of the heat spreader 3, thereby constituting a level difference structure having a height difference between the two die bond parts. A portion between the two die bond parts constitutes a concave portion CP having a smaller thickness than the two die bond parts. The upper surface of the heat spreader 3 is flat and does not have the level difference. A size of a largest portion in the heat spreader 3 in a planar surface direction is 10 mm 20 mm, for example. The level difference 32 having a width of 0.5 mm and a height 0.5 mm, for example, is formed on the end edge portion on the upper surface side of the heat spreader 3.

The heat spreader 3 is disposed so that the die bond parts 21 and 22 are located on an upper side, and a die bond adhesive agent 20 is supplied by a dispenser on the die bond parts 21 and 22. The die bond adhesive agent 20 is solidified at a cure temperature of 200° C. using an Ag sintering agent which is a low temperature sintering agent containing an Ag nanopowder, for example.

The semiconductor chips 11 and 12 are mounted on the die bond parts 21 and 22, respectively, to which the die bond adhesive agent 20 is supplied. Both the semiconductor chips 11 and 12 are experimental Si semiconductor device. The semiconductor chip 11 has a thickness of 0.4 mm and a size thereof in a planar surface direction is 7 mm 8 mm, for example, and the semiconductor chip 12 has a thickness of 0.2 mm and a size thereof in a planar surface direction is 8 mm 8 mm, for example. The heat spreader 3 on which the semiconductor chips 11 and 12 are mounted is put in an oven, and the die bond adhesive agent 20 is cured by heating, thus the semiconductor chips 11 and 12 are die-bonded to the die bond parts 21 and 22, respectively.

As described above, the heat spreader 3 has the height difference between the two die bond parts, and the die bond part 21 is smaller than the die bond part 22 by 0.2 mm. The semiconductor chip 11 has the thickness of 0.4 mm, and the semiconductor chip 12 has the thickness of 0.2 mm, thus when the semiconductor chip 11 is die-bonded on the die bond part 21 and the semiconductor chip 12 is die-bonded on the die bond part 22, an active surface of the semiconductor chip 11 and an active surface of the semiconductor chip 12 are located on the same planar surface.

Next, in a process illustrated in FIG. 4, the heat spreader 3 to which the semiconductor chips 11 and 12 have been die-bonded is mounted on the interposer substrate 5 so that the semiconductor chips 11 and 12 are directed downward. The interposer substrate 5 has a thickness of 0.4 mm and a size thereof in a planar surface direction is 13 mm 23 mm, for example.

The interposer substrate 5 has a plurality of circular electrodes having a diameter of 0.2 mm (not shown), for example, and has the inner bump 41 thereon. The inner bump 41 is made of solder containing Sn (tin) and Sb (stibium), and has a spherical shape with a diameter of 0.3 mm, for example.

The number and an arrangement pattern of the inner bumps 41 are different between a region where the semiconductor chip 11 faces in the interposer substrate 5 and a region where the semiconductor chip 12 faces, and are set to correspond to the number and an arrangement pattern of electrodes 13, 14 on the active surfaces of the semiconductor chips 11 and 12, respectively. The electrodes 13, 14 on the active surfaces of the semiconductor chips 11 and 12 are circular electrodes each having a diameter of 0.2 mm, for example, and solder-mounted while having contact with the inner bump 41 to achieve a flip-chip bonding. A known technique can be applied to the flip-chip bonding, thus the description thereof is omitted.

Next, as illustrated in FIG. 5, after the semiconductor chips 11 and 12 are flip-chip bonded on the interposer substrate 5, a dam agent is drawn to circle around the end edge portion of the interposer substrate 5 three times using a dispenser robot and cured, thereby forming the dam 61 having a width of 1 mm and a height of 2 mm, for example. An epoxy resin for COB (chip on board) can be adopted as the dam agent.

The dam 61 is provided in proximity to the heat spreader 3, but is provided to have a gap with the end edge portion of the heat spreader 3. A height of the dam 61 is set not to be higher than the upper surface of the heat spreader 3 at least, and is set to prevent the liquid sealing resin 62, which is raised from the gap between the dam 61 and the end edge portion of the heat spreader 3, from creeping up to the upper surface of the heat spreader 3 in a case where the liquid sealing resin 62 is injected in the following process. For this purpose, the height of the dam 61 is preferably set to be 20 to 95% of a height from the upper surface of the interposer substrate 5 to the upper surface of the heat spreader 3.

Next, in a process illustrated in FIG. 6, the liquid sealing resin 62 is injected into a region defined by the dam 61, the heat spreader 3, and the interposer substrate 5 using a dispenser robot to fill the gap with the sealing resin 62. The dam 61 is provided, thus even when the liquid sealing resin 62 has a low viscosity smaller than 50 Pa S at normal temperature, for example, the injected sealing resin 62 is prevented from flowing outside the interposer substrate 5, and the sealing resin 62 can be injected up to a scheduled height.

At this time, when the liquid sealing resin 62 is injected from the gap between the end edge portion of the heat spreader 3 and the dam 61, the opening part 31 (FIG. 2) in the heat spreader 3 serves as a degassing part, thus air can be prevented from being confined in the sealing resin 62 and forming a void (air gap). Subsequently, the interposer substrate 5 is put in an oven, and the sealing resin 62 is cured by heating to solidify the sealing resin 62, thereby the insulation sealing is achieved.

The liquid sealing resin 62 may be injected from the opening part 31 in the heat spreader 3, and in such a case, the gap between the end edge portion of the heat spreader 3 and the dam 61 serves as a degassing part, and the liquid sealing resin 62 is raised from the gap and solidified, thereby firmly bonding the heat spreader 3 and the dam 61. The liquid sealing resin 62 is injected from the opening part 31, thus the liquid sealing resin 62 can be evenly injected.

Finally, the outer bump 42 made of solder is mounted on a circular electrode with a diameter of 0.5 mm (not shown), for example, provided on the lower surface of the interposer substrate 5, and the solder is melted, thus the semiconductor package 100 illustrated in FIG. 1 can be obtained. The outer bump 42 contains Sn (tin), Ag (silver), and Cu, and has a spherical shape with a diameter of 0.7 mm, for example.

The semiconductor package 100 in which the sealing resin 62 does not remain on the upper surface of the heat spreader 3 can be obtained through the above process.

FIG. 7 is a plan view of the heat spreader 3 to which the semiconductor chips 11 and 12 are die-bonded, that is to say, the heat spreader 3 in FIG. 4 viewed from an active surface side of the semiconductor chips 11 and 12. The opening part 31 provided on the central portion of the heat spreader 3 has an oval shape having a length of 6 mm along a longitudinal direction of the concave portion CP and a width of 3 mm along the short-side direction of the concave portion CP. The shape of the opening part 31 is not limited thereto, and the number thereof is not also limited to one. The position where the opening part 31 is provided is not limited to the central portion of the heat spreader 3.

FIG. 8 is a plan view of the interposer substrate 5 viewed from an upper surface side. A plurality of electrodes 51 for mounting the inner bump 41 are provided, and a region other than a region where the electrodes 51 are provided and the end edge portion of the interposer substrate 5 is covered by a solder resist 55.

Figure 9:
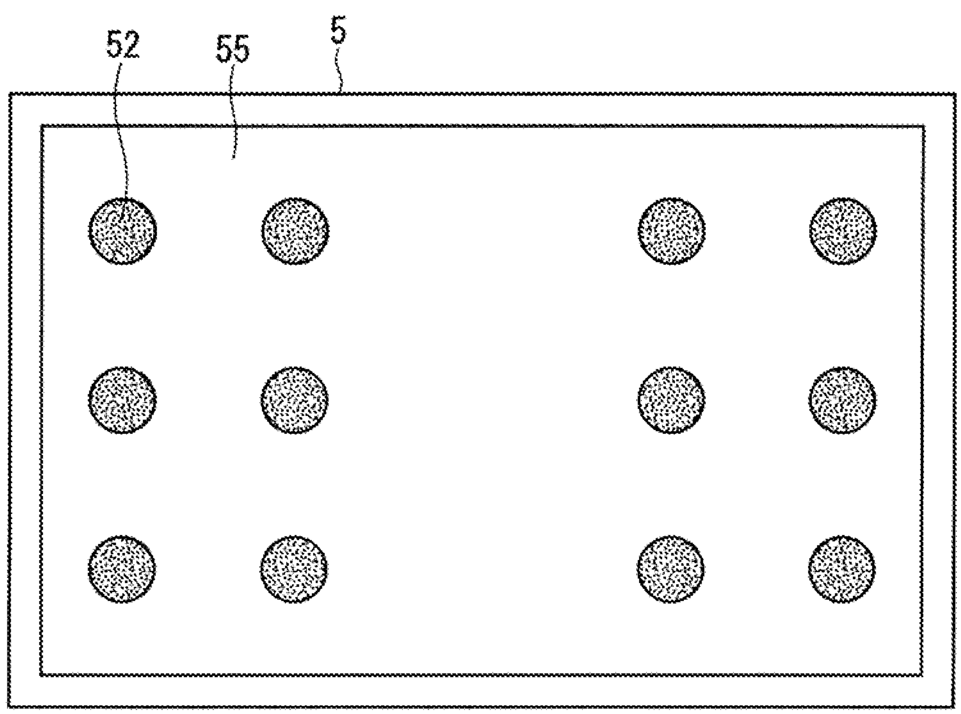
FIG. 9 A plan view of the interposer substrate viewed from a lower surface side.

FIG. 9 is a plan view of the interposer substrate 5 viewed from a lower surface side. A plurality of electrodes 52 for mounting the outer bump 42 are provided, and a region other than a region where the electrodes 52 are provided and the end edge portion of the interposer substrate 5 is covered by the solder resist 55.

Figure 10:
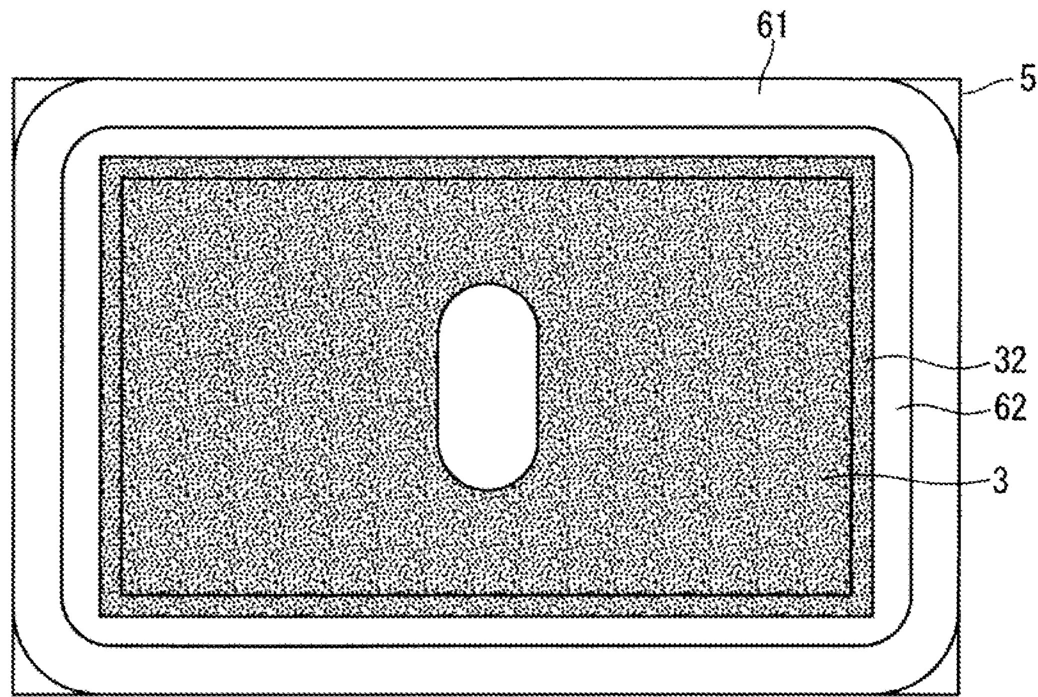
FIG. 10 A plan view of the interposer substrate before a resin sealing viewed from the upper surface side.

FIG. 10 is a plan view of the heat spreader 3 viewed from the upper surface side in a state where the heat spreader 3 on which the semiconductor chips 11 and 12 are mounted is bonded on the interposer substrate 5 via the inner bump 41 and the dam 61 is formed, that is to say, a state illustrated in FIG. 5. In this stage, the level difference 32 provided on the end edge portion of the heat spreader 3 can be seen.

The opening part 31 in the heat spreader 3 is used as an injection hole at the time of injecting the liquid sealing resin 62, thus the resin can be evenly injected even in a case where there is a small gap and the sealing resin 62 hardly penetrates thereto.

The level difference 32 on the end edge portion of the heat spreader 3 has an effect of elongating a creeping distance of a side surface of the heat spreader 3 to prevent the liquid sealing resin 62 from creeping from the side surface up to the upper surface of the heat spreader 3 and covering the upper surface, thereby reducing a heat radiation property. As illustrated in FIG. 1, the sealing resin 62 is raised midway in the level difference 32 and firmly bonds the heat spreader 3 and the dam 61, thus has an effect of suppressing a separation between the heat spreader 3 and the interposer substrate 5.

Another Example of Application

The following example is applicable to the semiconductor package 100 according to the embodiment 1 described above. That is to say, described is the example that the experimental Si semiconductor device is applied to both the semiconductor chips 11 and 12, however, the semiconductor to be applied is not limited thereto, but silicon carbide (SiC) semiconductor device, gallium nitride (GaN) semiconductor device, and gallium arsenic (GaAs) semiconductor device, for example, are applicable, and the effect similar to that of the Si semiconductor device can be obtained.

The example of using the Ag sintering agent is described as the die bond adhesive agent 20 forming the bonding layer 2, however, Au (gold) —Sn (tin) solder, Pb (lead) —Sn (tin) solder, and Sn (tin) —Sb (stibium) solder, for example, may also be used, and the effect similar to the case of using the Ag sintering agent can be obtained.

Cu is used as the heat spreader 3, however, Cu tungsten alloy, CIC (Cu/inver/Cu) clad material, for example, is also be applicable, and the effect similar to the case of using Cu can be obtained.

The heat spreader 3 is Ni/Au-plated, thus the bonding layer 2 can be easily formed when the bonding layer 2 is formed using the solder. Al is used for the heat spreader 3 and Cu plating is applied, thus weight saving can be achieved.

In the above description, the inner bump 41 is made of the solder containing Sn and Sb, however, the similar effect can be obtained also when the inner bump 41 is made of Au—Sn solder or Pb—Sn solder. The similar effect can be obtained also by a combination of an Au stud bump and an Ag adhesive agent and a connection using a solder ball having a Cu core.

The level difference 32 is formed on the end edge portion of the heat spreader 3, thus a length of an interface between the end portion of the heat spreader 3 and the sealing resin 62 is increased. Accordingly, adhesion strength can be increase, and a time until fluid or the like penetrates can be increased, thus reliability can be improved.

The level difference 32 in the heat spreader 3 is located in the position lower than a top of the dam 61, thus the injected sealing resin 62 can reliably cover the level difference.

The concave portion CP having the smaller thickness than the two die bond parts is provided in a connection part between the die bond part 21 and the die bond part 22 (between the die bond parts) in the heat spreader 3, thus the two die bond parts having the different thickness are not serially configured. When a portion where the pans having the different thickness are serially configured to form the level difference is formed by a cutting process, a portion having a curvature in a corner of the level difference occurs. When the semiconductor chip is disposed to be raised over the portion having the curvature, there is a possibility that the semiconductor chip is bonded in an oblique posture, and a gap occurs between the portion having the curvature and the semiconductor chip and remains as a void. However, the concave portion CP is provided, thus the two die bond parts having the different thickness are configured to be separated from each other, thus the occurrence of such defects can be prevented. The opening part 31 is formed in the concave portion CP having the small thickness at the time of forming the opening part 31 in the heat spreader 3, thus achievable is the effect that the formation process can be easily performed.

In the above description, the outer bump 42 is made of the solder containing Sn, Ag, and Cu, however, the similar effect can be obtained also when the outer bump 42 is made of Sn (tin) —Zn (zinc) solder or Bi (bismuth) —Sn (zinc) solder. The similar effect can be obtained also by a combination of an Au stud bump and an Ag adhesive agent and a connection using a solder ball having a Cu core. A pin grid array (PGA) having an insertion mounting pin may be used instead of the outer bump 42, and a land grid array (LGA) using the electrode 52 (FIG. 9) for mounting the outer bump 42 as a surface mounting electrode may also be used.

The glass epoxy substrate is used as the interposer substrate 5, however, the similar effect can be used also when a polyimide substrate or a ceramic substrate is used.

The epoxy resin in which the silica filler is diffused is used as the dam 61, however, the dam may be made up of a resin component having heat resistance such as polyphenylene sulfide (PPS) or an aluminum plate, or the similar effect can be obtained also by a configuration that the end edge portion of the interposer substrate 5 is processed to have the dam shape.

When the liquid sealing resin 62 has a high viscosity equal to or higher than 50 Pa S and equal to or smaller than 500 Pa S at normal temperature, for example, the injected sealing resin 62 is considered to stop flowing at or near the end edge portion of the interposer substrate 5. In such a case, the process of providing the dam 61 described above using FIG. 5 can be omitted, and after the process of mounting the heat spreader 3 described above using FIG. 4 on the interposer substrate 5, the liquid sealing resin 62 is injected to cover a side surface part of the heat spreader 3 using a dispenser robot.

As illustrated in FIG. 1, the sealing resin 62 is formed to reach a top part of the dam 61. An area of adhesion to the heat spreader 3 is larger than a case where the sealing resin 62 remains midway in the height of the dam 61, thus reliability on a temperature cycle can be improved.

The epoxy resin in which the silica filler is diffused is used as the liquid sealing resin 62, however, alumina may also be adopted as a filler, and the similar effect can be obtained also in a case of using a silicon resin.

Modification Example 1

The semiconductor package 100 according to the embodiment 1 described above has the level difference structure in which there is the height difference between the two die bond parts in the heat spreader 3, and corresponds to the semiconductor chips 11 and 12 having the different thickness, however, it is possible to correspond to the difference in the thickness also by using an inner bump having a different size for a semiconductor chip having a different thickness.

Figure 11:
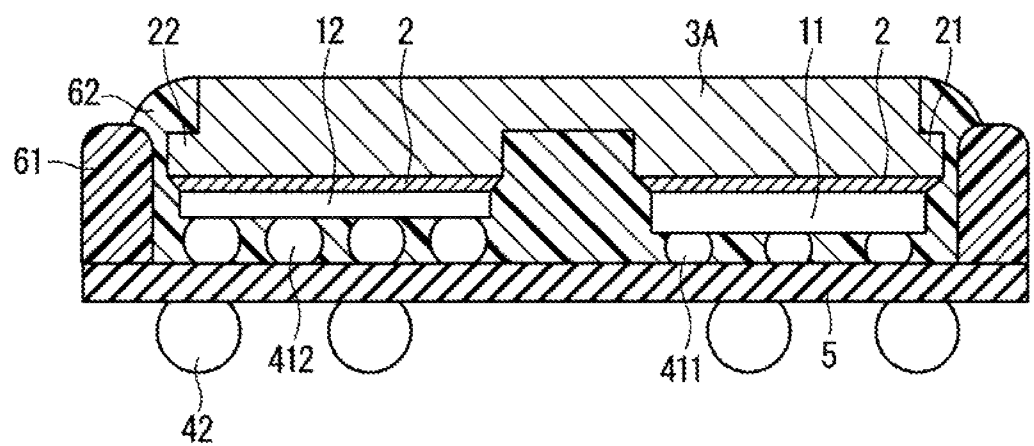
FIG. 11 A cross-sectional view illustrating a configuration of a semiconductor package according to a modification example 1 of the embodiment 1 in the present invention.

That is to say, as is a case for a semiconductor package 100A illustrated in FIG. 11, applicable is a heat spreader 3A in which the semiconductor chip 11 having the thickness of 0.4 mm is bonded to an inner bump 411 (a bonding material) having a diameter of 0.3 mm and the semiconductor chip 12 having the thickness of 0.2 mm is bonded to an inner bump 412 (a bonding material) having a diameter of 0.5 mm, thereby setting the thickness of both the die bond parts 21 and 22 to 2 mm. As described above, when the inner bumps having the different diameter, that is to say, the different height are used, the height difference needs not be provided between the two die bond parts, thus the method of supplying the die bond adhesive agent 20 on the die bond parts 21 and 22 described above using FIG. 3 can be changed to a print supply with high productivity for supplying an adhesive agent using a mask.

The thickness of the two die bond parts in the heat spreader 3A is unified, thus a manufacturing cost of the heat spreader 3A is reduced, and also achievable is an effect that the heat spreader 3A can be easily obtained.

Modification Example 2

In the semiconductor package 100 according to the embodiment 1, a gap length between the heat spreader 3 and the interposer substrate 5 is determined in accordance with the height of the inner bump 41 disposed on the interposer substrate 5, however, a support body for setting the gap length may be provided.

Figure 12:
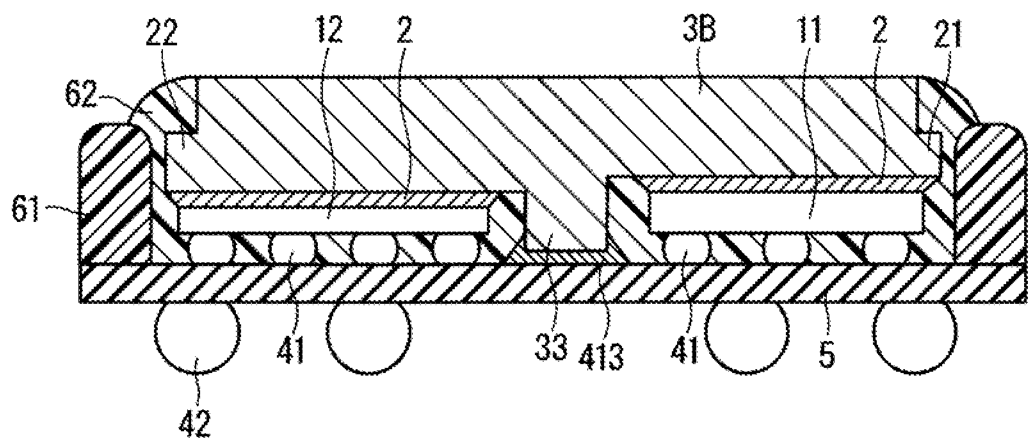
FIG. 12 A cross-sectional view illustrating a configuration of a semiconductor package according to a modification example 2 of the embodiment 1 in the present invention.

That is to say, as is a case for a semiconductor package 100B illustrated in FIG. 12, applicable is that a protruding part 33 extending from a position between the die bond part 21 and the die bond part 22 in a heat spreader 3B toward the interposer substrate 5 is provided, and a tip portion of the protruding part 33 has contact with the main surface of the interposer substrate 5 and is bonded to the interposer substrate 5 by a solder or a resin bonding part 413.

The protruding part 33 is provided, thus the gap length between the heat spreader 3B and the interposer substrate 5 can be set more accurately by the height of the protruding part 33. The portion where the heat spreader 3B has direct contact with the interposer substrate 5 is provided, thus a thermal stress, which acts only on the inner bump 41 located between the semiconductor chips 11 and 12 and the interposer substrate 5 in the case where the protruding part 33 is not provided, also acts on the protruding part 33. Accordingly, the thermal stress is dispersed and the thermal stress acting on the inner bump 41 is reduced. As a result, reliability of the semiconductor package is improved.

FIG. 12 illustrates the example that the tip portion of the protruding part 33 is bonded to the interposer substrate 5 by the bonding part 413, however, also applicable is a configuration that the bonding part 413 is not provided but the tip portion of the protruding part 33 has simply contact with the main surface of the interposer substrate 5. The bonding part 413 is not provided, thus a manufacturing cost and the number of manufacturing processes can be reduced.

The protruding part 33 is provided, thus heat of the interposer substrate 5 can be directly discharged to the heat spreader 3B, and also achieved is an effect of suppressing increase in a temperature of the interposer substrate 5.

The protruding part 33 may have a column shape or a square pole shape, and the number of protruding parts 33 is not limited to one, but a plurality of protruding parts 33 may be provided.

The effect similar to that of the semiconductor package 100B can also be obtained by sandwiching a spacer having a column shape or a square pole shape between the concave portion CP located between the two die bond parts in the heat spreader 3 and the interposer substrate 5 illustrated in FIG. 1 instead of the protruding part 33. In this case, the spacer may be bonded to the heat spreader 3 and the interposer substrate 5, or may simply have contact therewith.

Modification Example 3

In the semiconductor package 100 according to the embodiment 1, the inner bump 41 disposed on the interposer substrate 5 supports the heat spreader 3, however, a support body for supporting the heat spreader 3 may be provided.

Figure 13:
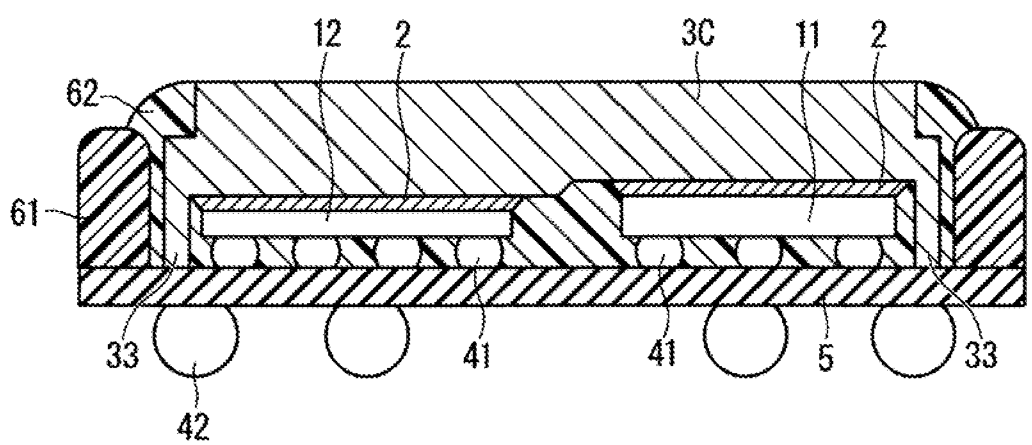
FIG. 13 A cross-sectional view illustrating a configuration of a semiconductor package according to a modification example 3 of the embodiment 1 in the present invention.

That is to say, as is a case for a semiconductor package 100C illustrated in FIG. 13, applicable is that a plurality of protruding parts 33 extending from an end edge portion of a main surface of a heat spreader 3C on a side where the die bond parts 21 and 22 are provided toward the interposer substrate 5 are provided, and tip portions of the protruding parts 33 have contact with the main surface of the interposer substrate 5.

The plurality of protruding parts 33 are provided on the end edge portion of the heat spreader 3C, thus the gap length between the heat spreader 3C and the interposer substrate 5 can be set more accurately by the height of the protruding parts 33, and the height of the heat spreader 3C from the interposer substrate 5 can be uniformed to ensure parallelism on the interposer substrate 5.

The portion where the heat spreader 3C has direct contact with the interposer substrate 5 is provided, thus a thermal stress, which acts only on the inner bump 41 located between the semiconductor chips 11 and 12 and the interposer substrate 5 in the case where the protruding parts 33 are not provided, also acts on the protruding parts 33. Accordingly, the thermal stress is dispersed and the thermal stress acting on the inner bump 41 is reduced. As a result, reliability of the semiconductor package is improved.

The tip portions of the protruding parts 33 may be bonded to the interposer substrate 5 by a solder or the resin bonding part 413. Each of the protruding parts 33 may have a column shape or a square pole shape.

The effect similar to that of the semiconductor package 100C can also be obtained by sandwiching a plurality of spacers each having a column shape or a square pole shape between the end edge portion of the main surface of the heat spreader 3 on the side where the two die bond parts are provided and the interposer substrate 5 illustrated in FIG. 1 instead of the protruding parts 33. In this case, the spacers may be bonded to the heat spreader 3 and the interposer substrate 5, or may simply have contact therewith.

Modification Example 4

In the semiconductor package 100 according to the embodiment 1, the heat generated in the semiconductor chips 11 and 12 is discharged mainly from the upper surface of the heat spreader 3, however, the heat may also be discharged to a side of the interposer substrate 5.

Figure 14:
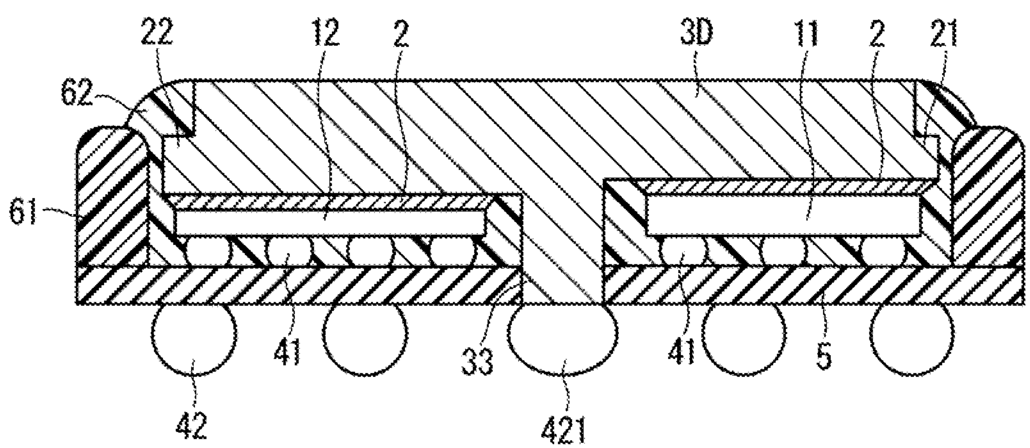
FIG. 14 A cross-sectional view illustrating a configuration of a semiconductor package according to a modification example 4 of the embodiment 1 in the present invention.

That is to say, as is a case for a semiconductor package 100D illustrated in FIG. 14, applicable is that a protruding part 33 extending from a position between the die bond part 21 and the die bond part 22 in a heat spreader 3D toward the interposer substrate 5 is provided, a tip portion of the protruding part 33 passes through the interposer substrate 5 and is exposed to the lower surface of the interposer substrate 5, and an outer bump 421 having the same height as the outer bump 42 is bonded to the tip portion of the protruding part 33.

Accordingly, the heat generated in the semiconductor chips 11 and 12 can also be discharged outside via the protruding part 33 and the outer bump 421, thus a heat radiation efficiency of the whole semiconductor package can be increased.

The portion where the heat spreader 3D has direct contact with the interposer substrate 5 is provided, thus a thermal stress, which acts only on the inner bump 41 located between the semiconductor chips 11 and 12 and the interposer substrate 5 in the case where the protruding part 33 are not provided, also acts on the protruding part 33. Accordingly, the thermal stress is dispersed and the thermal stress acting on the inner bump 41 is reduced. As a result, reliability of the semiconductor package is improved.

The protruding part 33 may have a column shape or a square pole shape, and the number of protruding parts 33 is not limited to one, but a plurality of protruding parts 33 may be provided. When the protruding part 33 has the square pole shape, the plurality of outer bumps 421 are bonded to the tip portion of the square pole, thus a heat radiation efficiency can be increased.

The outer bump 421 is directly bonded to a heat radiation pad provided on a mother board (not shown) on which the semiconductor package 100D is mounted, for example, thus the heat generated in the semiconductor chips 11 and 12 can be discharged outside.

Modification Example 5

In the semiconductor package 100 according to the embodiment 1, the upper surface of the heat spreader 3 is flat, however, a cooling fin may be provided on the upper surface.

Figure 15:
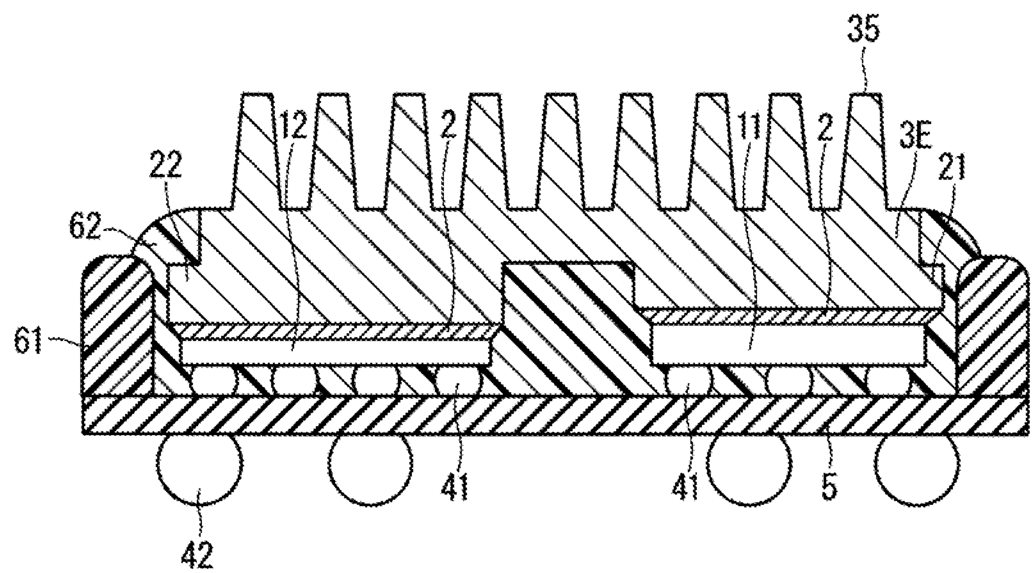
FIG. 15 A cross-sectional view illustrating a configuration of a semiconductor package according to a modification example 5 of the embodiment 1 in the present invention.

That is to say, as is a case for a semiconductor package 100E illustrated in FIG. 15, a cooling fin 35 may be provided on an upper surface of a heat spreader 3E to further increase the heat radiation efficiency. According to such a configuration, a cooling capacity can be improved without attaching the semiconductor package to a cooling block provided outside, for example.

Modification Example 6

In a region where an operation frequency of the semiconductor chip exceeds 1 GHz, there is a possibility that a characteristic degradation occurs when the active surface of the semiconductor chip is covered by the sealing resin 62 having a high specific permittivity, and a structure that the active surface is not covered by the sealing resin 62 may be preferable in some cases. Accordingly, it is considered that the arrangement of the inner bump 41 dams the sealing resin 62 to prevent the sealing resin 62 from flowing inside the arrangement of the inner bump 41, or the viscosity of the sealing resin 62 is set to high so as to be equal to or larger than 50 Pa S and equal to or smaller than 500 Pa S at normal temperature to prevent the sealing resin 62 from flowing inside the arrangement of the inner bump 41, so that the structure that the active surface is not covered by the sealing resin 62 is ensured.

Figure 16:
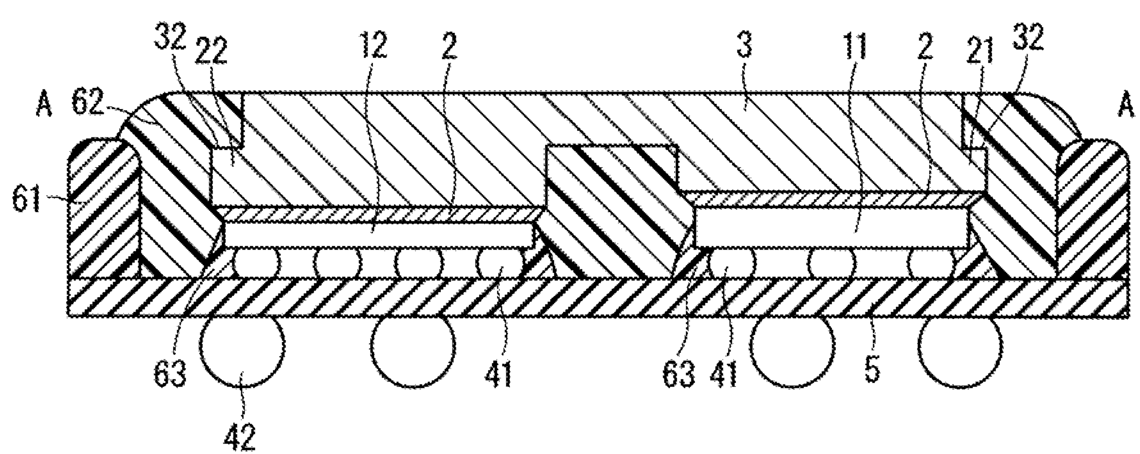
FIG. 16 A cross-sectional view illustrating a configuration of a semiconductor package according to a modification example 6 of the embodiment 1 in the present invention.

Considered as the other method is a method of damming the sealing resin 62 by a dam also formed around the semiconductor chip. FIG. 16 illustrates one example thereof.

A semiconductor package 100F illustrated in FIG. 16 includes a dam 63 (an inner barrier) provided in proximity to the arrangement of the inner bump 41 in addition to the dam 61 provided on the end edge portion of the interposer substrate 5. The dam 63 is provided on an outer periphery of the arrangement of the inner bump 41, thus when the liquid sealing resin 62 is injected in the injection process of injecting the sealing resin 62 described above using FIG. 6, the dam 63 dams the sealing resin 62, thus the sealing resin 62 is not injected inside the arrangement of the inner bump 41. Thus, the active surface of the semiconductor chips 11 and 12 is not covered by the sealing resin 62, and a region between the active surface of the semiconductor chips 11 and 12 and the main surface of the interposer substrate 5 forms a hollow region HR. The dam 63 dams the sealing resin 62, thus is provided to have at least the same height as the inner bump 41.

The dam 63 can be formed by drawing a dam agent on the outer periphery of the arrangement of the inner bump 41 using a dispenser robot in a state where the heat spreader 3 described above using FIG. 4 is mounted on the interposer substrate 5.

The dam 63 may also be formed by drawing a dam agent on the outer periphery of the arrangement of the inner bump 41 using a dispenser robot in a state where the arrangement of the inner bump 41 is mounted on the interposer substrate 5 before the process of mounting the heat spreader 3 described above using FIG. 4 on the interposer substrate 5.

An epoxy resin for COB (chip on board) can be adopted as the dam agent of the dam 63 in the manner similar to the dam 61, and also applicable is that the dam 63 is also cured in the curing process of curing the dam 61 after the dam agent is drawn on the end edge portion of the interposer substrate 5 using the dispenser robot in the process described above using FIG. 5.

FIG. 17 is a top view of the semiconductor package 100F in which the heat spreader 3 and the dam 61 are conveniently omitted to illustrate an arrangement state of the dam 63 on the interposer substrate 5. A region surrounded by the dam 63 forms the hollow region HR.

Embodiment 2

The method of manufacturing the semiconductor package 100 according to the embodiment 1 illustrated in FIG. 1 is described using FIG. 3 to FIG. 6, wherein one heat spreader 3 to which the semiconductor chips 11 and 12 are bonded is mounted on one interposer substrate 5. However, it is also applicable that a multiple surface mounting substrate on which the plurality of heat spreaders 3 can be mounted is adopted as the interposer substrate, and the interposer substrate is finally divided into pieces for each heat spreader 3 to obtain semiconductor packages independent of each other.

Figure 18:
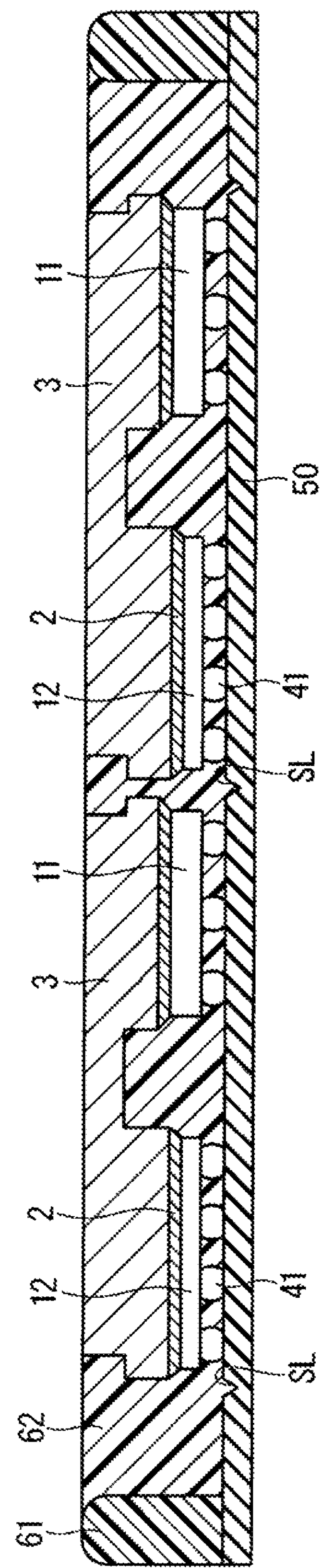
FIG. 18 A cross-sectional view for describing a method of manufacturing a semiconductor package according to an embodiment 2 of the present invention.

FIG. 18 and FIG. 19 are cross-sectional views for describing a method of manufacturing the semiconductor package according to the embodiment 2 of the present invention. FIG. 18 illustrates an example of adopting a multiple surface mounting interposer substrate 50 (a multiple surface mounting insulating substrate) on which the four heat spreaders 3 can be mounted in two rows and two columns, for example, and illustrates a stage that the four heat spreaders 3 are bonded on the multiple surface mounting interposer substrate 50 via the plurality of inner bumps 41 and a region defined by the dam 61, the heat spreader 3, and the multiple surface mounting interposer substrate 50 is filled with the sealing resin 62. In FIG. 18, the same reference numerals are assigned to the same configuration as the semiconductor package 100 described using in FIG. 1, and the repetitive description is omitted.

The manufacturing process up to the stage illustrated in FIG. 18 is the same as the manufacturing method according to the embodiment 1 described using FIG. 3 to FIG. 6, thus the repetitive description is omitted.

The multiple surface mounting interposer substrate 50 is an insulating substrate, and is a glass epoxy substrate including a glass epoxy and a conductive layer made of Cu, for example, having a thickness of 0.4 mm. The multiple surface mounting interposer substrate 50 has an area in a planar surface direction capable of assigning an area of 13 mm 23 mm to one heat spreader 3. A wiring pattern in an upper surface, a lower surface, and an inner side is wire-connected by a through hole not shown in a region (referred to a unit region) assigned to one heat spreader 3 in the manner similar to the interposer substrate 5 according to the embodiment 1. As illustrated in FIG. 8 and FIG. 9, the plurality of electrodes 51 for mounting the inner bump 41 and the plurality of electrodes 52 for mounting the outer bump 42 are provided. A plurality of slits SL for dividing the multiple surface mounting interposer substrate 50 into pieces are provided between the unit regions. The plurality of slits SL are provided along the dam 61.

When a dam agent is drawn on the end edge portion of the multiple surface mounting interposer substrate 50 using a dispenser robot, the dam agent is drawn, without having contact with any end portion of the heat spreader 3, a predetermined distance away from the end portion of the heat spreader 3 so that the dam 61 can also be removed in the division process. The predetermined distance is set so that a blade of a device used in the division processing, such as a dicing saw, for example, can be put in the multiple surface mounting interposer substrate 50.

FIG. 19 illustrates the process of dividing the multiple surface mounting interposer substrate 50. A blade of the dicing saw, for example, is put in the plurality of slits SL provided between the unit regions and the plurality of slits SL provided along the dam 61 as targets, cuts and divides the multiple surface mounting interposer substrate 50 for each heat spreader 3 together with the sealing resin 62, and separates the dam 61.

Finally, the outer bump 42 made of solder is mounted on a circular electrode with a diameter of 0.5 mm (not shown), for example, provided on the lower surface of the multiple surface mounting interposer substrate 50, and the solder is melted, thus the plurality of semiconductor packages 200 independent of each other illustrated in FIG. 19 can be obtained at the same time.

In this manner, the connection and the sealing process using the inner bump 41 can be collectively performed by adopting the multiple surface mounting interposer substrate 50 on which the plurality of heat spreaders 3 can be mounted, and productivity can be increased.

Described above is the example of dividing the multiple surface mounting interposer substrate 50 using the dicing saw, however, the multiple surface mounting interposer substrate 50 may be divided by a method such as wire cutting and laser fusing, for example. The plurality of slits SL provided between the unit regions and the plurality of slits SL provided along the dam 61 are not necessarily provided, however, when the multiple surface mounting interposer substrate 50 is a ceramic substrate which is not easy to cut, for example, the cutting process can be easily performed by providing the slits SL.

Described above is the example of adopting the interposer substrate 50 on which the four heat spreaders 3 can be mounted in two rows and two columns, however, the number of heat spreaders 3 to be mounted is not limited thereto. It is also applicable that an interposer substrate on which more heat spreaders 3 can be mounted is adopted to further increase the productivity.

Modification Example

In the method of manufacturing the semiconductor package according to the embodiment 2 described above, described is the example of mounting the plurality of heat spreaders 3 independent of each other on the multiple surface mounting interposer substrate 50, however, it is also applicable that a heat spreader in which a plurality of heat spreaders are connected by a thin connection part is mounted on the multiple surface mounting interposer substrate 50, and the heat spreader and the interposer substrate are finally divided into pieces to obtain semiconductor packages independent of each other.

FIG. 20 illustrates a stage of bonding a connection-type heat spreader 30 (a connection-type heat radiation member) in which the four heat spreaders 3 are connected in two rows and two columns, for example, on the multiple surface mounting interposer substrate 50 via the plurality of inner bumps 41 and filling a region defined by the dam 61, the connection-type heat spreader 30, and the multiple surface mounting interposer substrate 50 with the sealing resin 62.

In FIG. 20, the same reference numerals are assigned to the same configuration as the semiconductor package 100 described using in FIG. 1, and the repetitive description is omitted.

The manufacturing process up to the stage illustrated in FIG. 20 is the same as the manufacturing method according to the embodiment 1 described using FIG. 3 to FIG. 6, thus the repetitive description is omitted. The connection-type heat spreader 30 is made of copper, for example, and has a size in which the four head spreaders 3 are connected in two rows and two columns. A connection part CN is provided between the heat spreaders 3.

The connection part CN is formed thinner than a body part of the heat spreader 3, thereby being easily cut.

Such a connection-type heat spreader 30 is adopted and divided together with the multiple surface mounting interposer substrate 50, thus the productivity can be further increased.

The manufacturing process of the multiple surface mounting interposer substrate 50 is complex and a yield thereof is low, so that the multiple surface mounting interposer substrate 50 is hard to manufacture. Accordingly, the productivity can also be increased by bonding the plural pieces of interposer substrates to the connection-type heat spreader.

The present invention has been shown and described in detail, the foregoing description is in all aspects illustrative and not restrictive. It is therefore understood that numerous modifications and variations can be devised without departing from the scope of the invention.

According to the present invention, the above embodiments can be arbitrarily combined, or each embodiment can be appropriately varied or omitted within the scope of the invention.

The invention claimed is:

1. A semiconductor package, comprising:

an insulating substrate;

a first semiconductor chip in which an active surface is bonded on a first main surface of the insulating substrate via a plurality of first bonding materials;

a second semiconductor chip, with a thickness smaller than a thickness of the first semiconductor chip, in which an active surface is bonded on the first main surface via a plurality of second bonding materials;

a heat radiation member, wherein a main surface of the first semiconductor chip and a main surface of the second semiconductor chip located on respective opposite sides of the active surface of the first semiconductor chip and the active surface of the second semiconductor chip are bonded to a lower surface of the heat radiation member;

a barrier surrounding an end edge portion of the first main surface of the insulating substrate and extending in a vertical direction of the first main surface to have a gap with the side wall of the heat radiation member; and a sealing resin having contact with at least part of a side wall of the heat radiation member without being raised over an upper surface of the heat radiation member to seal the first and second semiconductor chips on the insulating substrate, wherein the barrier has a gap with an end edge portion of the heat radiation member and has a height not to be higher than an upper surface of the heat radiation member and in the heat radiation member, a thickness of a first bonding part to which the first semiconductor chip is bonded is smaller than a thickness of a second bonding part to which the second semiconductor chip is bonded.

2. The semiconductor package according to claim 1, wherein the gap is filled with the sealing resin.

3. The semiconductor package according to claim 1, comprising an inner barrier provided on an outer periphery of an arrangement of the plurality of first bonding materials and an outer periphery of an arrangement of the plurality of second bonding materials, wherein the semiconductor package includes a hollow region in which the active surface of each of the first and second semiconductor chips is not covered by the sealing resin inside the arrangement of the plurality of first bonding materials and the arrangement of the plurality of second bonding materials.

4. The semiconductor package according to claim 1, wherein the heat radiation member includes at least one protruding part extending from the lower surface toward the insulating substrate, a tip portion of the at least one protruding part having contact with the first main surface of the insulating substrate.

5. The semiconductor package according to claim 1, wherein the heat radiation member includes at least one protruding part extending from the lower surface toward the insulating substrate, a tip portion of the at least one protruding part passing through the insulating substrate.

6. The semiconductor package according to claim 1, wherein the heat radiation member includes a cooling fin provided on the upper surface.

7. The semiconductor package according to claim 1, wherein the heat radiation member includes an opening part passing through from the upper surface to the lower surface.

8. The semiconductor package according to claim 7, wherein the opening part is provided in the heat radiation member between positions where the first and second semiconductor chips are disposed.

9. The semiconductor package according to claim 1, wherein the heat radiation member has a level difference provided on the end edge portion.

10. The semiconductor package according to claim 9, wherein the level difference is provided in a position lower than a top of the barrier.

* * * * *